United States Patent [19]

Felten

[11] Patent Number: 4,598,037

[45] Date of Patent: Jul. 1, 1986

[54] PHOTOSENSITIVE CONDUCTIVE METAL COMPOSITION

[75] Inventor: John J. Felten, Newark, Del.

[73] Assignee: E. I. Du Pont de Nemours and Company, Wilmington, Del.

[21] Appl. No.: 685,028

[22] Filed: Dec. 21, 1984

[51] Int. Cl.⁴ .............................................. G03C 5/44
[52] U.S. Cl. ..................................... 430/281; 427/44; 427/54.1; 430/192; 430/330; 522/71
[58] Field of Search ............... 430/199, 281, 270, 330; 427/44, 54.1; 204/159.16

[56] References Cited

U.S. PATENT DOCUMENTS

| | | | |
|---|---|---|---|
| 3,355,291 | 11/1967 | Baird et al. | 96/27 |
| 3,443,944 | 5/1969 | Wise | 96/36.2 |
| 3,573,908 | 4/1971 | Minetti | 96/34 |
| 3,615,457 | 10/1971 | Seibert et al. | 96/35.1 |
| 3,877,950 | 4/1975 | Felten | 96/115 |
| 3,885,964 | 5/1975 | Nacci | 430/328 |
| 3,914,128 | 10/1975 | Scheiber et al. | 96/115 |
| 3,958,996 | 5/1976 | Inskip | 96/115 |
| 3,982,941 | 9/1976 | Inskip | 96/34 |
| 4,343,875 | 8/1982 | Spickenreuther | 430/198 |

*Primary Examiner*—Jack P. Brammer

[57] ABSTRACT

A photosensitive conductive metal coating composition which is fireable in a weakly oxidizing atmosphere comprising an admixture of a. Smooth finely divided particles of conductive metal, and
b. Finely divided particles of cadmium-containing lead aluminosilicate glass, dispersed in a solution of
c. Acrylic polymer binder
d. Volatile plasticizer,
e. A photoinitiation system, and
f. Photohardenable monomer.

4 Claims, No Drawings

PHOTOSENSITIVE CONDUCTIVE METAL COMPOSITION

FIELD OF INVENTION

The invention relates to photosensitive conductive metal compositions and particularly to such compositions which can be fired in a weakly oxidizing atmosphere.

BACKGROUND OF THE INVENTION

Thick film conductors are widely used as a means of interconnecting various passive and active devices for hybrid microcircuits and resistor networks. In this application, thick film fabrication of components has long been an economically attractive alternative to the use of thin films which involve the deposition of metal particles by vacuum evaporation or sputtering. However, relatively limited resolution capability of screened thick films has been a significant impediment to still more widespread use of thick film techniques. Typically, under the most carefully controlled circumstances, 5 mil (127 $\mu$m) lines and spaces can be achieved, especially with gold conductors. In some instances, as low as 4 mil (102 $\mu$m) lines and spaces can be achieved in limited quantity production when printing gold or copper thick films.

To overcome difficulties in screen printing, numerous approaches directed to providing high resolution thick film patterns have been devised. For example, the screen printing operation has been improved by such things as development of better resins for screen emulsions, improved wire mesh, stronger frames, flatter substrates and more compliant lower mass squeegee printheads. Another approach has been the development of coatings such as Prinar ® to reduce the surface energy of substrates and prevent ink spreading. (Prinar ® is a registered trademark of E. I. du Pont de Nemours and Company, Wilmington, DE for screen printing aids.) Also, thick film paste with improved powders, resins, solvents, flow modifiers and wetting agents have been developed. A still further approach to the problem of obtaining finer lines and spaces is (1) to apply a layer of the conductive material to a substrate by means of dispersion in a photosensitive medium, (2) to expose the layer imagewise to actinic radiation, (3) to solvent develop the pattern to remove unexposed portions of the layer, and (4) to fire the remaining exposed portions of the pattern to remove all remaining organic materials and to sinter the inorganic materials. This technique is revealed in several issued patents such as U.S. Pat. No. 3,443,944 to Wise, U.S. Pat. No. 3,615,457 to Seibert, U.S. Pat. No. 3,958.996, U.S. Pat. No. 3,982,941 to Inskip, U.S. Pat. No. 3,877,950 to Felten and U.S. Pat. No. 3,914,128 to Scheiber et al. U.S. Pat. No. 3,355,291 to Baird et al. and U.S. Pat. No. 3,573,908 to Minetti describe a method for applying glass to a semiconductor device by applying a photosensitive paste of the glass, exposing, solvent developing and firing the exposed areas.

Notwithstanding the effectiveness of the prior art processes for applying such electronic materials as a paste, it would also be advantageous to apply such materials as a dimensionally stable film. There are several advantages to the use of film, including: (1) better surface uniformity, (2) better layer thickness uniformity, (3) a thicker layer can be applied, thus taking few steps to achieve thick fired layers, (4) greater processing uniformity, (5) longer storage life, (6) minimum sensitivity to dirt pickup, and (7) avoidance of viscosity drift due to paste drying on the printing screen. Consequently, there is a strongly unmet need for conductive dispersions which can be applied by either conventional methods, such as screen printing, where appropriate, or as a laminated film where the properties named above are important.

SUMMARY OF THE INVENTION

In its primary aspect, the invention is directed to a photosensitive conductive metal coating composition which is fireable in a mildly oxidizing atmosphere comprising an admixture of:

a. Smooth finely divided particles of conductive metal at least 95% wt. of which have an aspect ratio of no more than 2 and have a particle size of 2-$\mu$m, and b. Finely divided particles of cadmium-containing lead borosilicate glass having a softening point of 500°-600° C., at least 80% wt. of which have a particle size of 2-6 $\mu$m, both a. and b. being dispersed in an organic medium comprising c. Acrylic polymeric binder, d. Plasticizer and e. A photoinitiation system in f. Photohardenable monomer, the plasticizer comprising from 15 to 30% wt. of the polymeric binder and the monomer comprising from 20 to 33% wt. of the polymeric binder.

In a secondary aspect, the invention is directed to a photosensitive film comprising a layer of the above-described photosensitive composition from which the solvent has been removed by volatilization.

In a still further aspect, the invention is directed to a patterned conductive layer comprising the above-described photosensitive film which has been (1) laminated to a ceramic substrate, (2) exposed imagewise to actinic radiation to effect hardening of the exposed areas of the film, (3) solvent developed to remove unexposed areas of the film, and (4) fired in a substantially nonoxidizing atmosphere to effect volatilization of the organic medium and sintering of the inorganic binder.

DETAILED DESCRIPTION OF THE INVENTION

A. Conductive Metal

Copper and nickel, aluminum and alloys and mixtures of each can be used as the conductive metal for the compositions of the invention. However, to function effectively in the composition, it is necessary that the particles of these metals have certain physical characteristics.

A most important feature of the compositions of the invention is that they are uniformly photohardenable throughout a considerable fraction of the thickness of the layers made therefrom despite the fact that they contain quite high concentrations of conductive metal particles which make the layers essentially opaque. To accomplish this, it is necessary that both the smoothness and aspect ratio of at least 95% by weight of the particles be carefully controlled. In particular, it is necessary that the metal particles be smooth in order to minimize light scattering from the surface of the particles. The term "smooth" as it is used herein, refers to the texture of particle surfaces which does not deviate in roughness by more than about 0.1 wave length of light. In general terms, this means that deviations which exceed this criterion will be clearly visible when viewed at 6000X with a scanning electron microscope (SEM). Nevertheless, particles having gross surface deviations in excess of about 0.75 μm may still be effective in the invention. Similarly, it is necessary that at least 80% by weight of the conductive metal particles have an aspect ratio of no more than 2 and that 80% by weight of the particles be no less than 2 μm in size in order that the light penetration into the layer will be sufficient. On the other hand, the particles should not be larger than about 6 μm lest sintering be retarded to an extent that large voids are incurred at the firing temperature. The sphericity of the particles (i.e. low aspect ratio) is doubly beneficial in that it not only gives better light penetration, it also provides cleaner development because of less residue adhering to the substrate. Ideally the conductive material should approach a monodisperse particle size distribution. However, current technology is limited practically to on the order of 80–95% wt. particles falling within the range of 2–6 μm. It is preferred whenever possible, however, to have at least 90% wt. of the particles fall within this range.

It is well known that clean metal surfaces have a high surface energy which results in a strong gradient toward a lower energy state. Such surfaces easily absorb gases such as oxygen which react chemically with strongly electropositive metal atoms to form a strongly bonded oxide layer on the surface (see Past, *Glass-Metal "Interfaces" and Bonding*, U. of California, Lawrence Radiation Laboratory, Berkeley, CA, Report UCRL 10611, 1963). By virtue of this mechanism, most metal surfaces which have been cleaned contain a layer of oxide. Such metal oxides can be significant in the formulation of the compositions of the invention in that, in the case of nickel and copper, the amount of surface oxide should be minimized because of the substantial light absorbtivity of the oxides of these two metals. On the other hand, in the case of aluminum particles the ubiquitous presence of surface oxide is not at all harmful since $Al_2O_3$ helps refract light. When it is desired to remove surface oxide from the particles which are used in the composition of the inventions, the method taught by Nair in U.S. Pat. No. 4,477,296 can be used. Protective coatings such as titania or alumina may be added to copper or nickel powders to help passivate them to oxidation and also help refract incident light which might otherwise be absorbed at the metal surface.

B. Inorganic Binder

The inorganic binder of the metal particles of the composition of the invention is a cadmium-containing lead aluminosilicate glass. Such glasses typically fall within the following compositional range:

PbO: 32 to 35 mole %
$SiO_2$: 55 to 60 mole %
CdO: 2 to 4 mole %
$Al_2O_3$: 3 to 6 mole %.

However, in addition to these four basic components, the glass may contain up to 5 mole % of an adhesion promoter such as ZnO, $Fe_3O_4$, $Cr_2O_3$ or mixtures thereof. Adhesion promoters such as silver, silver oxide, zinc oxide and mixtures thereof may also be used. The cadmium content of the glass has been found to be effective in promoting better adhesion between the glass and the conductive metal particles. A particularly preferred glass composition of this type contains on a molar basis 33.8% PbO, 58.7% $SiO_2$, 2.9% CdO and 4.7% $Al_2O_3$.

In addition to its chemical composition, the physical properties of the binder are important as well. In particular, it is essential that the binder have a softening point (Dilatometer) of 500°–600° C. A softening point of at least 500° C. is important in order to avoid excessive trapping of organic materials, during the firing stage. On the other hand, a softening point above 600° C. must be avoided lest the viscosity of the glass on firing be too high to obtain adequate wetting of the underlying substrate and adhesion promoters which may be used therewith. In general, it is preferred that both the glass and the conductive metal have the largest particle size consistent with good sintering of each. The glass particles of the invention should have particle size and shape similar to those of the conductive metal. That is, at least 80% wt. and preferably 90% wt. of the particles should be no less than 2 μm in size and no larger than 6 μm.

The glass binder will ordinarily constitute 15 to 25% by volume of the fired conductor layer which is approximately 8.5 to 11.5% by weight of the conductive metal content of the composition. In most instances, it is preferred to use as much glass as possible since light transmission and adhesion are improved thereby. However, the amount of glass must be consistent with obtaining adequate electrical conductivity and solderability.

The binder is prepared by conventional glassmaking techniques by mixing the desired components in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1 to 1½ hours. The melt is then poured into cold water. The maximum temperature of the water during quenching is kept as low as possible by increasing the water-to-melt ratio. The crude frit after separation from water is freed of residual water by drying in air or displacing the water by rinsing with methanol. The crude frit is then ball milled down to size in alumina containers using alumina balls. Alumina contamination of the frit is not within the observable limit of by X-ray diffraction analysis.

After discharging the milled frit slurry from the mill, excess solvent is removed by decantation and the frit powder is air dried at room temperature. The dried powder is then screened through a 325-mesh screen to remove any large particles. The inorganic binder, like the ceramic solids, should have a surface-to-weight ratio of no more than 5 $m^2/g$ and at least 95% wt. of the particles should have a particle size of 1–10 μm.

C. Polymeric Binder

In a composition such as this which is to be fired at a high temperature to remove all the organics, the composition of the polymeric binder is quite important. This importance is even greater when, as here, the composition contains base metal conductive materials and therefore must be fired, at least initially, in a weakly oxidizing atmosphere to avoid oxidation of the base metal. More particularly, the polymer must be capable of complete thermal decomposition in an atmosphere containing only limited amounts of oxygen and yet leave essentially no carboneous or other residue. For this reason, it is necessary to use as binder an acrylic polymer such as a poly(alkyl acrylate) or poly(alkyl methacrylate) or various copolymers thereof. Acidic or amine copolymers thereof are preferred in order to improve the ability of the organic medium to sustain the dispersion of solids thereon. Such copolymers can contain up to 5 wt. % of carboxylic acid or amine which moieties improve dispersion stability. In addition to such acrylate/acid bipolymers, multipolymers of 50–75% wt. $C_{1-8}$ alkyl methacrylate and 50–25% wt. $C_{1-8}$ alkyl acrylate and 0–5% wt. ethylenically unsaturated carboxylic acid or amine can be used in the invention. It is preferred that the binder polymer have a glass transition temperature ($T_g$) of at least 30° C. but not more than about 50° C. When $T_g$ is less than 30° C., the polymers have too little strength and are sticky and when $T_g$ is about 50° C., the polymers have insufficient flexibility and tend not to adhere well to the solids dispersed therein.

D. Plasticizer

The nature of the plasticizer to be used in the composition of the invention is quite important. The plasticizer must not only be an effective solvent for the acrylic polymer, it must also have appropriate volatility. In particular, it is necessary that the plasticizer undergo very little evaporation when it is heated to as high as 200° C. during film manufacture. Yet it must undergo essentially complete evaporation well before it reaches a temperature of 800°–900° C. during the firing step. Thus, the plasticizer must have a boiling range of 200°–350° C. and preferably 280°–330° C. By the use of a plasticizer carefully chosen to meet these volatility criteria, the plasticizer is essentially completely removed by evaporation with essentially no thermal decomposition in the front part of the firing oven in which parts made therefrom are processed.

The most effective plasticizers for this purpose have been found to be the alkyl esters of phthalic acid. These include dibutyl phthalate, ethyl hexyl phthalate, benzyl ethyl phthalate, dioctyl phthalate, dodecyl phthalate, dimethyl phthalate, diethyl phthalate, and dipropyl phthalate. Polyethylene glycol phthalate can also be used. Mixtures of plasticizers will frequently be used to obtain particular volatility characteristics within the above-mentioned broad range of boiling points.

An important and unique feature of the invention is that it is preferred to maximize the amount of plasticizer which is used relative to the amount of binder polymer. Thus, it is preferred to use a binder polymer having a high $T_g$ with a maximum amount of plasticizer rather than a polymer having a lower $T_g$ which requires a smaller amount of plasticizer. By maximizing the plasticizer, the composition requires less polymer which must be burned out. This, in turn, facilitates the use of greater amounts of organics which give greater light penetration through the composition. For this reason, the amount of plasticizer must constitute at least 10% wt. and preferably at least 12% wt. of the polymer. However, the plasticizer should not be greater than 30% wt. of the binder polymer and preferably not more than 25% wt. About 15% plasticizer has been found to be optimum in most cases.

It will, of course, be recognized that the amount of plasticizer which can be used effectively depends, not only on the polymer, but to a substantial extent upon the particle size and surface area of the solids in the composition. For example, high surface area solids tend to incur higher absorption of liquids and thus are more viscous at any given level of plasticizer and binder. On the other hand, lower surface area solids absorb less liquids and are therefore less viscous at any given level of plasticizer and binder.

E. Photoinitiation System

Suitable photoinitiation systems are those which are thermally inactive but which generate free radicals upon exposure to actinic light at or below 185° C. These include the substituted or unsubstituted polynuclear quinones which are compounds having two intracyclic carbon atoms in a conjugated carboxylic ring system. These include 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydro-carbon-substituted aromatic acyloins, including α-methylbenzoin, 60-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

It is essential that the initiator system be free of halides in order to avoid problems with corrosion of electronic components with which the invention is used.

F. Photohardenable Monomer

The photohardenable monomer component of the invention is comprised of at least one addition-polymerizable ethylenically unsaturated compound having at least one polymerizable ethylenic group. Such compounds are capable of forming a high polymer by free radical-initiated, chain propagating addition polymerization. Preferably, the unsaturated compound (monomer) has from two to four terminal ethylenically unsaturated groups. The monomeric compounds are nongaseous, that is, they have an atmospheric boiling point above 100° C. They must also have a plasticizing action on the organic polymeric binder.

Suitable monomers which can be used alone or in combination with other monomers include acrylic monomers such as t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831. 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxy-phenyl)propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an akylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are polyoxyethylated trimethylolpropane triacrylate, ethylated pentaerythritol trisulfate, dipentaerythritol monohydroxypentaacrylate and 1,10-decanediol dimethylacrylate. The unsaturated monomeric component is present in 5 to 45% by weight based on the total weight of the dry photopolymerizable layer.

Minor amounts of other components can be present in the photopolymerizable compositions, e.g., pigments, dyes, thermal polymerization inhibitors, adhesion promoters, such as organosilanes, plasticizers, coating aids such as polyethylene oxides, etc. so long as the photopolymerizable compositions retain their essential properties.

Because of difficulty in volatilization, it is desirable to minimize the amount of monomer in the composition consistent with retaining good development properties of the photohardened binder. Thus, the amount of monomer is 20-33% wt. of the binder and preferably 25-30% wt. About 28% wt. monomer has been found to be optimum in most instances.

The organic constituents of the compositions of the invention serve as a vehicle for dispersion of the finely divided solids of the composition in such form that they can readily be applied to a ceramic or other substrate. Thus, the organic medium must first of all be one in which the solids are dispersible with an adequate degree of stability. Secondly, the rheological properties of the organic medium must be such that they lend good application properties to the dispersion.

When the dispersion is to be made into a film, the organic medium in which the conductive metal solids and inorganic binder are dispersed consists of the above-described polymeric binder, plasticizer, monomer and initiator. Optionally, other dissolved materials such as dispersing agents, stripping agents, and wetting agents may be present.

The photosensitive compositions of the invention will most frequently be employed as the photosensitive portion of a resist composite in which the photosensitive layer is coated upon a support film.

In conventional photoresist elements, it is necessary, or at least highly desirable, to protect the photosensitive layer by a removable cover sheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototool.

The photopolymerizable composition is coated upon the support film at a dry coating thickness of about 0.001 inch (~0.0025 cm) to about 0.01 inch (~0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (~0.0013 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.001 inch (~0.0025 cm).

When an element contains no removable, protective cover sheet and is to be stored in roll form, the reverse side of the strippable support preferably has applied thereto a film release layer of a material such as wax or silicone to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer during storage prior to use.

On the other hand, when the compositions of the invention are formulated as thick film compositions, they will usually be applied to a substrate by means of screen printing. Therefore, they must have appropriate viscosity so that they can be passed through the screen readily. The organic medium is preferably formulated also to give appropriate wettability of the solids and the substrate, good drying rate, dried film strength sufficient to withstand rough handling and good firing properties. Satisfactory appearance of the fired composition is also important.

When the dispersion is to be applied as a thick film paste, conventional thick film solvent can be used with appropriate rheological adjustments.

In view of all these criteria, a wide variety of inert liquids can be used as organic solvents. The organic medium for most thick film compositions is typically a solution of resin in a solvent and, frequently, a solvent solution containing both resin and thixotropic agent. The solvent usually boils within the range of 130°–350° C.

An especially suitable medium for this purpose is a solution of polymethacrylates of lower alcohols in the monobutyl ether of ethylene glycol monoacetate.

The most widely used solvents for thick film applications are terpenes such as alpha- or beta-terpineol or mixtures thereof with other solvents such as kerosene, dibutylphthalate, butyl carbitol, butyl Carbitol acetate, hexamethylene glycol and high boiling alcohols and alcohol esters. Various combinations of these and other solvents are formulated to obtain the desired viscosity and volatility requirements for each application.

The ratio of organic medium to inorganic solids in the dispersions can vary considerably and depends upon the manner in which the dispersion is to be applied and the components of organic medium used. Normally, to achieve good coverage, the dispersions will contain complementally by weight 60-90% solids and 40-10% organic medium. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (Sec$^{-1}$) | Viscosity (Pa · s) | |
|---|---|---|
| 0.2 | 100-5000 | — |
| | 100-300 | Preferred |
| | 100-150 | Most preferred |
| 4 | 40-400 | — |
| | 80-120 | Preferred |
| 192 | 40-80 | — |
| | 40-70 | Preferred |
| | 40-50 | Most preferred |

The amount and type of organic solvents utilized is determined mainly by the final desired formulation viscosity and print thickness.

Various dyes and pigments may also be added to increase visibility of the photo image. Any colorant used, however, should preferably be transparent to the actinic radiation used, although it may be opaque or strongly absorb other radiation in the visible or UV spectral region.

In addition to the many parameters of properties and composition described above, it is essential that all of the components—both inorganic and organic—be substantially free of halogens. The reason for this is that, under normal firing conditions, halogens tend to be released which cause corrosion of the conductive layer as well as parts of the furnace in which they are fired.

EXAMPLES

Example 1

In this example, a conventional photohardenable composition was formulated in which the copper powder was irregularly shaped, the glass binder was not size-classified and a slow drying solvent was used to facilitate screen printing. The material was prepared by thoroughly mixing all constituents, then roll milling to about 150 lbs. roll pressure, and sieving through a 400 mesh screen to remove "boulders".

TABLE I

FORMULATION OF CONVENTIONAL PHOTOSENSITIVE COPPER PASTE

| | Wet | After Drying |
|---|---|---|
| Cu (2μ dia, irregular shape) | 59.0% | 73.0% |
| Glass[1] | 5.5 | 6.8 |
| Shell Ionol ®[2] | 0.5 | 0.6 |
| Butyl Carbitol Acetate | 18.9 | |
| Methyl Methacrylate | 9.4 | 11.4 |
| Zelec TD[3] | 0.3 | 0.4 |
| TEOTA Anthraquinone | 4.4 | 5.4 |
| T—Bu Anthraquinone | 1.0 | 1.2 |

[1] By weight, 33.8% PbO, 58.7% SiO$_2$, 2.9% CdO and 4.7% Al$_2$O$_3$.
[2] Ionol ® is a trademark of Shell Chemical Co., Houston, TX for hindered phenol antioxidants.
[3] Zelec is a registered trademark of E. I. du Pont de Nemours and Company, Inc. for antistatic and mold release agents.

Comparison of the properties of this conventional conductive paste with those of the laminated films (Table 4) shows clearly the shortcomings of the conventional fired films, i.e., unacceptable fired thickness, impractical exposure speed, very poor fired film opacity, significant undercut, and poor burnout properties.

Examples 2 and 3

In examples 2 and 3, compositions were formulated and tested in which the effect of particle size of the copper could be observed. The compositions were formulated by dissolving resins in methylene chloride, adding copper and glass binders, and optionally the photoactive components, then milling in a jar mill with glass beads. Final formulation with readily soluble components, e.g., plasticizer and monomer, was done in some cases after the powders had been milled in the solvent/resin solution.

Coatings were made by applying the coating suspension to Mylar ®[4] polyester film base and allowing the methylene chloride to evaporate. Typical thickness of dried films was 1.0 to 1.2 mills, produced with a 4 mil doctor blade.

(4) Mylar ® is a registered trademark of E. I. du Pont de Nemours and Company, Inc., Wilmington, DE for polyester film.

Parts were laminated at approximately 80°-100° C. using about 40 psi (300 kPa) pressure. Parts were run through the laminator two or three times to assure lamination on substrate edges. Development was carried out in a spin developer using chlorothene developer fluid sprayed in a fan shaped pattern about 3 inches (7.5 cm) above the spinning part at a rate of about 5-8 mL/sec.

Parts were fired in a belt furnace using nitrogen atmosphere with variable oxygen injection levels in the burnout zone. For a furnace with tight seals and a relatively high atmosphere flow in the burnout zone, about 0.75 cubic diameter/hr. per cubic decimeter of muffle volume in the burnout zone with about 100 ppm O$_2$ injection is sufficient.

Formulations of the two compositions are given in Table 2 below:

TABLE 2

| EFFECT OF CONDUCTIVE METAL PARTICLE SIZE ON CONDUCTIVE PROPERTIES | | |
|---|---|---|
| Example No. | 2 | 3 |
| Composition | % wt. | |
| Copper | | |
| 1 μm irregular | 79.8 | — |
| 2 μm spherical | — | 81.15 |
| Inorganic Binder[5] | 5.9 | 5.8 |
| Organic Binder[6] | 7.85 | 4.65 |
| Monomer[7] | 3.2 | 4.0 |

TABLE 2-continued
EFFECT OF CONDUCTIVE METAL PARTICLE SIZE ON CONDUCTIVE PROPERTIES

| Example No. | 2 | 3 |
|---|---|---|
| Composition | % wt. | |
| Initiator[8] | 3.2 | 2.5 |
| Eythyl Cellulose | 0.15 | 0.1 |
| Dimethyl phthalate | — | 1.2 |

[5] By weight, 82% $Bi_2O_3$, 11% PbO, 3.5% $SiO_2$ and 3.5% $Al_2O_3$.
[6] Elvacite ® 2010, poly(methyl methacrylate)
[7] TEOTA 1000, polyoxyethylated trimethylol propane triacrylate, M. Wt. 1162
[8] t-butyl anthraquinone The film produced from the standard copper particles (Example No. 2) was extremely slow and required 6–14 minutes exposure to UV light. Moreover, the edges of the photohardened edges were severely undercut. This indicates that the less regular copper particles adsorbed excessive light at the surface and that exposure below the surface was inadequate to get good resistance to the developing solvent. In Example 3, the lower oxide content and surface area/volume ratio of the copper, in addition to the additional plasticizer combined to produce a film having superior light penetration and better exposure and development properties.

EXAMPLES 4–6

These examples differ from Examples 2 and 3 in that a higher softening point glass was used. Also a faster initiator system that doubled exposure speed was used. Table 3 contains their formulation and Table 4 lists properties of all six conductive materials.

TABLE 3
COMPOSITIONS

| Example No. | 4 | 5 | 6 |
|---|---|---|---|
| Composition | | % wt. | |
| Copper (2μ dia avg.) | 73.8 | 72.7 | — |
| Copper (2μ dia with no submicron fraction) | — | — | 73.2 |
| Glass[1] | 6.8 | — | — |
| Glass (classified to remove submicron fraction) | — | 6.8 | 6.4 |
| TEOTA 1000[7] | 4.5 | 4.5 | 4.2 |
| Methyl Methacrylate | 11.6 | 10.9 | 11.0 |
| Michler's Ketone | 0.2 | 0.2 | 0.2 |
| Benzophenone | 3.0 | 3.1 | 3.1 |
| Ethyl Cellulose | 0.1 | 0.1 | 0.1 |
| Dibutyl Phthalate | — | 1.7 | 1.8 |

[7] polyoxyethylated trimethylolpropane triacrylate, M. Wt. 1162.

TABLE 4
PERFORMANCE PROPERTIES OF FILMS

| Example No. | 1 | 2 | 3 | 4 | 5 | 6 |
|---|---|---|---|---|---|---|
| Exposure Speed (min.) | 4 | 6–10 | 2–3 | 1–2 | 1.5 | 0.5–1 |
| As-Fired Thickness (μm) | 7 | 10 | 10 | 10 | 10 | 13 |
| Line Definition | Very Good | Fair | Very Good | Very Good | Very Good | Very Good |
| As-Fired Opacity | Very Poor | Fair | Fair | Good | Very Good | Excellent |
| Undercut | Signif. | Severe | Signif. | Signif. | V. Little | V. Little |
| Burnout | Poor | V. Poor | V. Poor | Poor | Fair | Fair |
| Conductivity (Milliohms/square) | 5 | 5 | 5 | 4–5 | 4 | 3–3.5 |

Example 4 contained no plasticizer or classified powder; Example 5 contained plasticizer and classified glass; and Example 6 contained plasticizer, classified glass, and classified copper powders to enhance exposure speed and burnout. In general, when fine particles are eliminated from glass and copper, exposure speed is increased, the amount of organics necessary to produce a functioning film is reduced, lineshape of developed patterns is improved because of better light penetration, and shrinkage during firing is reduced. On the other hand, excessively larger particle size retards the rate of sintering, which results in poorer conductivity and more voids in the fired film.

Example 6 is an example in which particle size of both copper and glass were carefully chosen, to give in an overall balance of superior properties.

I claim:

1. A photosensitive conductive metal coating composition which is fireable in a weakly oxidizing atmosphere comprising an admixture of:
   a. Smooth finely divided particles of conductive metal, at least 80% wt. of which (1) have an aspect ratio of no more than 2 and (2) have a particle size of 2–6 μm, and
   b. Finely divided particles of cadmium-containing lead aluminosilicate glass having a softening point of 500°–600° C., at least 80% wt. of which have a particle size of 2–6 μm, the admixture of a. and b. being dispersed in a solution of
   c. Acrylic polymer binder,
   d. Volatile plasticizer,
   e. A photoinitiation system and
   f. Photohardenable monomer having at least one addition-polymerizable ethylenically unsaturated group, the plasticizer comprising from 10 to 30% wt. of the polymeric binder and the monomer comprising from 20 to 33% wt. of the polymeric binder.

2. The composition of claim 1 in which the organic components c–f. are dissolved in volatile nonaqueous organic solvent.

3. A photosensitive conductive film comprising a layer of the composition of claim 2 from which the nonaqueous organic solvent has been removed by volatilization.

4. The composition of claim 2 which is a paste of consistency suitable for screen printing.

* * * * *